BISTABLE CIRCUITS HAVING UNIDIRECTIONAL FEEDBACK MEANS

Filed March 29, 1955 3 Sheets-Sheet 1

INVENTORS
ROBERT L. CROSBY
GREGORY J. PROM
JAMES R. KELSEY
BY Cushman, Darby & Cushman
ATTORNEYS Nov. 7, 1961 R. L. CROSBY ET AL 3,008,055

BISTABLE CIRCUITS HAVING UNIDIRECTIONAL FEEDBACK MEANS

Filed March 29, 1955 3 Sheets-Sheet 2

INVENTORS

ROBERT L. CROSBY

GREGORY J. PROM

JAMES R. KELSEY

BY Cushman, Darby & Cushman

ATTORNEYS

BISTABLE CIRCUITS HAVING UNIDIRECTIONAL FEEDBACK MEANS

Filed March 29, 1955 3 Sheets-Sheet 3

INVENTORS
ROBERT L. CROSBY
GREGORY J. PROM
JAMES R. KELSEY

BY Cushman, Darby & Cushman
ATTORNEYS 3,008,055
Patented Nov. 7, 1961

3,008,055

BISTABLE CIRCUITS HAVING UNIDIRECTIONAL FEEDBACK MEANS

Robert L. Crosby, Watertown, Mass., and Gregory J. Prom, St. Paul, and James R. Kelsey, Minneapolis, Minn., assignors to Sperry Rand Corporation, a corporation of Delaware Filed Mar. 29, 1955, Ser. No. 497,514
18 Claims. (Cl. 307—88.5)

This invention relates to transistor trigger circuits and more particularly to bistable circuits employing junction transistors.

The ever expanding utilization and the increased complexity of electronic equipment has led to a determined effort to replace thermionic tubes with components such as transistors to take advantage of their low power consumption, small heat dissipation, miniature size, and lesser likelihood of failure. The greater portion of research on transistors has concerned itself with point contact types, largely because of their earlier development compared to the junction transistor. In addition, point contact transistors exhibit the phenomenon of negative resistance and so offer considerable challenge to the scientific pioneer. For a number of reasons, however, the junction transistor is coming into greater favor compared to point contact types and is preferred for many applications. The junction transistor consumes considerably less power than the point contact; its input and output impedances are always positive, allowing greater freedom in circuit design; it is of more rugged construction and so has a longer life; it is capable of very high voltage and current gains; and a pair of junction transistors are far more likely to have similar characteristics than a pair of point contact transistors and so to a proportionate extent are more adaptable to interchangeable manufacture. Junction transistors are classed into two conductivity types. The n-p-n transistor comprises a body of semi-conductive material such as germanium containing a thin layer of p-type material interposed between zones of n-type material. In the p-n-p transistor, the reverse is true. Ohmic nonrectifying connections are made to each zone with a base connection made to the intermediate zone and emitter and collector connections made respectively to the outer zones.

A basic component of electronic data handling systems is the flip-flop circuit or bistable multi-vibrator which can be switched alternately between its two conditions of stable equilibrium by means of trigger pulses. If the switching is accomplished by pulses arriving from a single trigger input, the flip-flop becomes a scale-of-two counter or binary counter stage and so may be a basic building block in electronic data handling equipment as part of a binary-coded decade counter, accumulator, or the like. Almost all flip-flops based on transistors heretofore disclosed utilize point contact units, either singly or in pairs. When used singly, the point contact transistor is triggered between its two states of stable equilibrium which are separated by an unstable negative resistance region. However, the advantages of the junction transistor over point contact types enumerated above may outweigh the apparent saving of needing only one point contact transistor in a flip-flop circuit. Even the major argument in favor of the point contact units, viz., that they are capable of faster response, is being met by technological improvements, and junction transistors now being marketed can, in the practice of this invention, count pulses at a recurrence rate in the order of one megacycle per second.

It is accordingly an object of this invention to provide a novel flip-flop circuit based upon a pair of junction transistors.

It is a further object of this invention to provide a junction transistor flip-flop circuit which can count a series of pulses at a relatively high recurrence frequency.

It is another object of this invention to provide a binary counter stage based on a pair of junction transistors of one conductivity type for counting pulses of one polarity which can be modified for counting pulses of the opposite polarity by merely interchanging the transistors with a pair of opposite conductivity type and reversing certain circuit connections.

It is another object of this invention to provide a junction transistor flip-flop circuit having a low impedance output.

It is still another object of this invention to provide a flip-flop circuit based on semi-conductive devices which is characterized by its reliability and its responsiveness to input signals having a relatively wide range of amplitudes.

These and other objects of the invention may be best understood from the following description of illustrative embodiments of the invention, now described in detail with reference to the accompanying drawings, in which.

Figure 1:
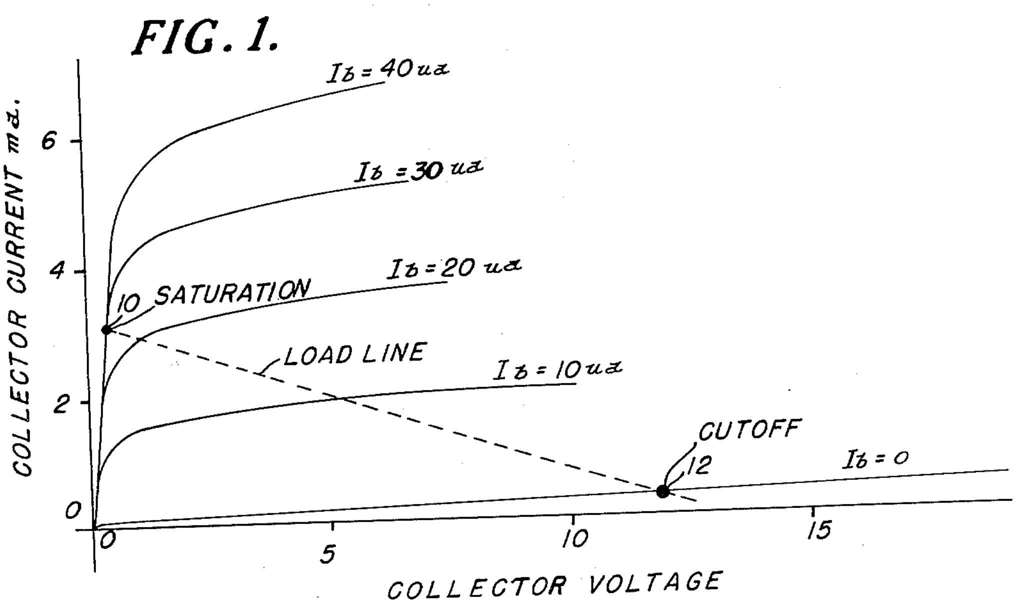
FIGURE 1 is a graph portraying certain operating characteristics of an n-p-n junction transistor suitable for use in this invention.

In FIGURE 1 static characteristics are shown for collector current vs. collector voltage of an n-p-n junction transistor with a grounded emitter. A resistive load which may be applied to the transistor is shown in chain line and designated "Load Line." Both the solid line characteristics and the load line are somewhat idealized and will vary to a certain extent with temperature, but the graph is adequate to explain the principles of the invention.

It is well known that in a grounded emitter n-p-n transistor the voltage of the base electrode stays very close to but slightly above ground and the current flowing into the collector is very nearly equal to that flowing out of the emitter. Hence, the current in the base is very small. Referring to FIGURE 1, it is seen that a very small change in the base current $I_b$, caused by a correspondingly small change in the base voltage $V_b$ (not shown), may produce a relatively large change in collector voltage $V_c$ and collector current $I_c$ to cause the operating point to swing up or down along the load line. However, when the transistor is operating at point 10, it will be appreciated that a substantial increase in $I_b$ will substantially not shift the operating point so that the transistor is said to be in collector current saturation. The application of a negative base current $I_b$ will have virtually no effect on the collector of a transistor operating at point 12 so that the transistor is then at collector current cutoff.

Figure 2:
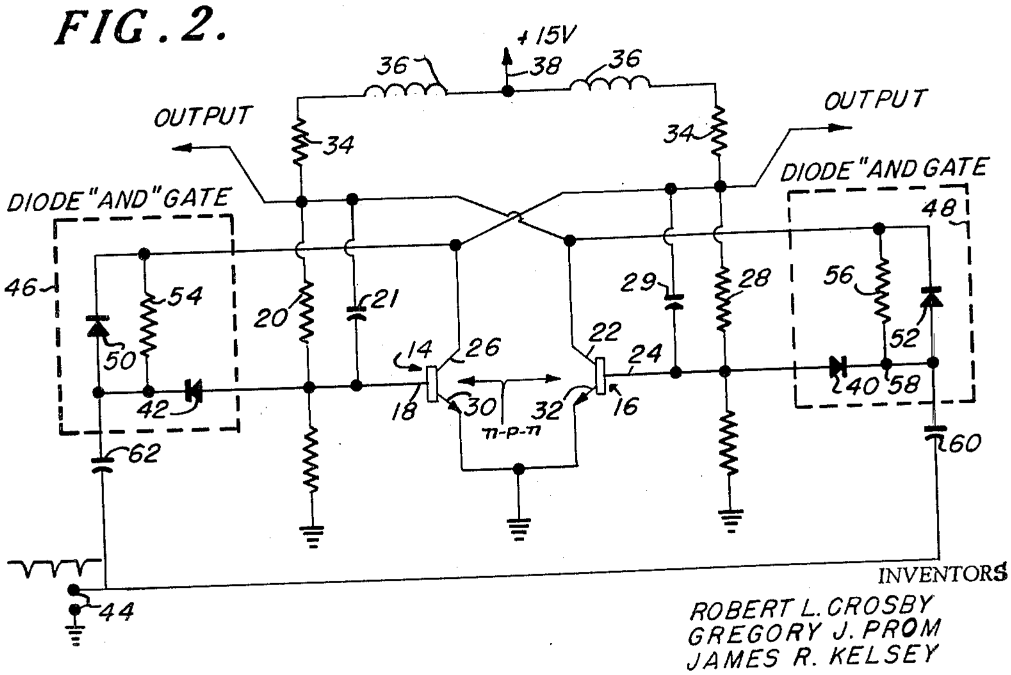
FIGURE 2 is a schematic diagram according to this invention of a binary counter stage employing a pair of n-p-n junction transistors which is switched alternately between its two conditions of equilibrium by a series of negative pulses.

Referring now to FIGURE 2, there is shown a circuit embodying this invention which employs a pair of n-p-n junction transistors 14, 16 in a flip-flop circuit or binary counter stage. The circuit is similar to the well known Eccles-Jordan vacuum tube configuration. That is, the base electrode 18 of transistor 14 is connected to collector electrode 22 of transistor 16 by a cross-coupling network consisting of resistor 20 and capacitor 21 in parallel. Base electrode 24 of transistor 16, in turn, goes to collector electrode 26 of transistor 14 through an identical network consisting of resistor 28 and capacitor 29. Emitter electrodes 30 and 32 of transistors 14 and 16, respectively, are mutually connected to ground. Collector electrodes 22, 26 are each connected through a load resistor 34 and a peaking inductor 36 to a fixed voltage supply on line 38 in the order of plus fifteen volts. Load resistors 34 should, of course, be selected to produce equivalent load lines for each transistor 14, 16 so that they will approximate the load line represented graphically in FIGURE 1.

Let it be assumed for purposes of explanation that transistor 14 is initially in the condition of collector current saturation (i.e., in its low collector voltage stable operating state) as represented by operating point 10 of FIGURE 1, while transistor 16 is at the collector current cutoff point 12—its high collector voltage stable operating state. The collector 22 of transistor 16 then has a value about plus twelve volts while collector 26 of transistor 14 is only a fraction of a volt above ground. Since the base electrode of each transistor is essentially at zero potential at all times, rectifying element 40 (preferably a crystal diode) connected to pass electrons or negative current to base electrode 24 when enabled, is biased in the reverse direction by approximately twelve volts while there is substantially zero potential drop across rectifying element 42 (again preferably a crystal diode), thereby bliasing rectifying element 42 so that it will pass electrons or negative, current received by it to its associated base electrode 18. A negative pulse of, say, five volts applied at input 44 is rejected by rectifying element 40 but is passed by rectifier 42 to base 18 of transistor 14, causing its collector voltage to rise sharply. Graphically speaking, the drop in base potential shifts the operating point of transistor 14 from a low potential stable state of saturation at point 10 of FIGURE 1 along the load line in the direction of point 12. This rise in collector potential, in turn, makes the base 24 of transistor 16 more positive, increasing the current in and lowering the voltage of collector electrode 22 of transistor 16. That is, the operating point of transistor 16 is shifted away from its high potential stable state of cutoff at point 12 toward point 10. The swing in potential at collector 22 of transistor 16 makes base 18 of transistor 14 more negative, furthering the switching action. It will be appreciated by those skilled in the art that the switching action will continue until transistor 14 is at cutoff and transistor 16 at saturation. The succeeding negative pulse at input 44 is now blocked by the reverse bias on rectifier 42, since the potential of collector electrode 26 is high, but passes rectifier 40, since the bias across it is practically zero, to return transistor 16 to cutoff and transistor 14 to saturation. It follows that a series of negative pulses at trigger input 44 alternately switch the flip-flop circuit of FIGURE 2 between two states of stable equilibrium with one transistor at saturation and the other at cutoff, the circuit being dynamically unstable when the transistors are at intermediate operating points.

Rectifying elements 40, 42 and like elements, such as rectifiers 50, 52 and their homologues in FIGURES 3 and 4, will be hereinafter referred to as diodes, although it will be understood any unidirectional current carrying device including multiple element tubes such as triodes may be utilized in their stead. The cathode of a diode and the corresponding electrode of any other unidirectional device is referred to herein, and particularly in the claims, as the "negative end," while the opposite electrode is called the "positive end." Diodes 40, 42, 140, and 142 individually are gating elements which may be replaced by any of the conventional gating means, as will be apparent to those skilled in the art.

Since the flip-flop circuit of FIGURE 2 is triggered by unipolar pulses at a single input, it is also a scale-of-two or binary counter stage. The diode "and" gates 46, 48 (which, as has been seen, are controlled—enabled or disabled—by the potentials of collector electrodes 26 and 22, respectively, to steer the trigger pulses properly) are each provided, respectively, with diodes 50, 52 shunting coupling resistors 54, 56. When diode 40 is biased to nonconduction so that diode 42 allows a negative trigger to pass, the reduction in potential at the collector 22 of transistor 16 provides a negatively-going swing of potential which is transmitted through diode 52 to reduce the fall time at point 58. Diode 52, by allowing the "negative" "pulse" at collector 22 to bypass resistor 56, effectively reduces the RC time constant of resistor 56 and capacitor 60 so that diode 40 is ready to pass the succeeding trigger pulse sooner than would otherwise be the case, thereby increasing the maximum pulse recurrence frequency. Where fast recovery is not required, diodes 50 and 52 may be eliminated from the circuit.

While it will be understood that the values of the components of FIGURE 2 may vary to a considerable extent according to the design for any specific application of the invention or according to the particular model of n-p-n junction transistor, the following parameter values are specified by way of example only with no limitation thereto being intended:

| | | |
|---|---|---|
| Resistors 34, 54, 56 | ohms | 4,700 |
| Resistors 20, 28 | do | 27,000 |
| Capacitors 21, 29 | micro-microfarads | 47 |
| Capacitors 60, 62 | do | 470 |
| Coil 36 | millihenries | 5 |

Figure 3:
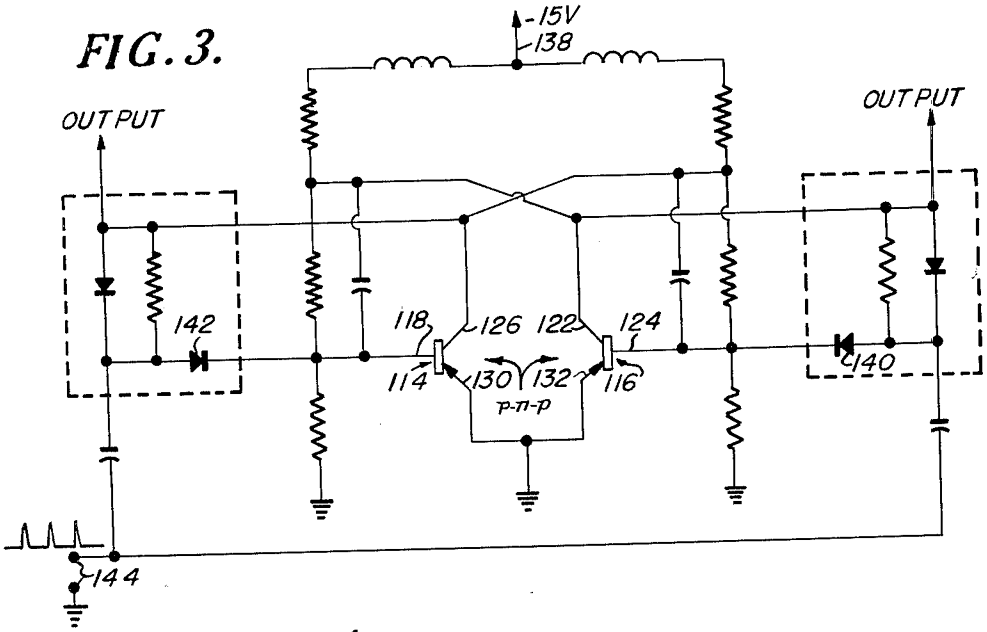
FIGURE 3 is a schematic diagram according to this invention of a binary counter stage based on p-n-p junction transistors which is triggered by positive pulses.

Reference is now made to FIGURE 3 to demonstrate the application of this invention to counting positive pulses in a scale-of-two. It will be readily apparent that the circuit of FIGURE 3 is identical to that of FIGURE 2 except that the n-p-n transistors are replaced by p-n-p transistors and the connections to the diodes and the D.C. voltage supply are reversed. For purposes of clarity, the reference character numbers of FIGURE 2 are applied to the corresponding components of FIGURE 3 prefixed by the hundreds digit 1.

In a p-n-p junction transistor, positive current flows into the emitter electrode and out of the collector electrode. The emitter electrodes 130 and 132 are again commonly connected to ground. When transistor 114 is in its low potential stable state (i.e., in the state of collector current saturation) its collector 126 is close to zero potential. By analogy to the reasoning applied in the discussion of the circuit of FIGURE 2, transistor 116 must then be in its high potential stable state (i.e., at cutoff) so that its collector 122 has a relatively high potential in the order of minus twelve volts, the D.C. voltage supply on line 138 being about minus fifteen volts. Accordingly, diode 140 connected to pass electrons from or positive current to base 124 when enabled is biased in the reverse direction by twelve volts while there is very little potential drop across diode 142. Since diode 142 is connected to pass electrons from or positive current to base 118, a positive pulse from source 144 is able to pass diode 142 and the resultant positive swing of base 118 of transistor 114 causes its collector 126 to take a negative swing which is transmitted to the base 124 of transistor 116. When the potential of the base 124 becomes less, the potential at the collector electrode 122 swings toward its low potential stable state (i.e., moves from cutoff near minus twelve volts towards saturation) and provides, therefore, a positively-going "pulse" tending to overcome the reverse bias on diode 140. When the reverse bias on diode 140 is reduced to a value less than the value of the incoming pulses at terminals 144, diode 142 will be biased in the reverse direction, and an incoming pulse will pass only through diode 140. The switching action proceeds in a manner similar to that described in connection with FIGURE 2 with each succeeding positive pulse reversing the state of both transistors 114, 116.

Insofar as the output impedance of the binary counters of FIGURES 2 and 3 is undesirably high for practical applications, it may be satisfactorily reduced by inserting in each collector lead an emitter follower in a manner analogous to the use of cathode followers in the plate circuits of vacuum tube flip-flops. The manner by which the circuit of FIGURE 2 may be so modified is shown in FIGURE 4, in which emitter follower circuits 70 and 72 are placed in the circuits of collector electrodes 26 and 22, respectively.

The emitter followers 70 and 72 may comprise n-p-n junction transistors 74 and 76, respectively, each connected in the so-called "grounded" collector configuration. That is, their collectors 78 and 80, respectively, are tied to the fixed voltage supply 38 while the base electrodes 82, 84 and emitter electrodes 86, 88 of each are free to assume potentials consonant with the associated circuitry even though the emitter electrodes 86 and 88 may be grounded through resistors 83 and 85, respectively, or preferably, as illustrated, connected by such resistors to sources 87 and 89 of approximately −7.5 volts each. Transistors 74, 76 may be but are not necessarily identical to transistors 14, 16. That is, with respect to the four transistors in FIGURE 4, it is possible to use (*a*) four n-p-n transistors, or (*b*) four p-n-p transistors, or (*c*) two n-p-n and two p-n-p transistors, in which last-mentioned case it is desirable that transistors 14 and 16 be alike, and that transistors 74 and 76 be alike. It is well established that when the collector voltage of a junction transistor is held constant, the emitter voltage will closely approximate the base voltage regardless of the amount of current drawn at the emitter. Hence, when transistor 14 is at current saturation so that its collector 26 is near ground potential, the base 82 of transistor 74 and, consequently, its emitter 86 are likewise near ground. At the same time, transistor 16 is at cutoff so that its collector 22 and the base 84 and emitter 88 of transistor 76 are all at about plus twelve volts. Output leads 90, 92 accordingly are held close to zero and twelve volts, respectively, regardless of variations in current flowing therethrough.

It should be noted that emitter followers 70, 72 act not only as impedance matching or lowering devices but as coupling means along with resistors 54′ and 56′, respectively, to allow the collector-base voltages of transistors 14, 16 to appear across diodes 42, 40, respectively, as in FIGURES 2 and 3. Resistors 54′ and 56′ may be considerably smaller than the corresponding resistors of FIGURE 2 which were kept high to avoid capacitive loading of transistors 14 and 16. Accordingly, diodes 50, 52 need no longer be included in the circuit because the RC time constants of resistor 54′, capacitor 62 and of resistor 56′, capacitor 60 are sufficiently small for high speed operation. Hence, by replacing two diodes with two transistors, the circuit of FIGURE 4 counts at the same rate as that of FIGURE 2 and in addition may be applied directly to a variety of situations because of its low impedance output. By way of example, the value of resistors 54′, 56′ may be 1,000 ohms as compared to the 4,700 ohms suggested for resistors 54, 56 of FIGURE 2.

Figure 4:
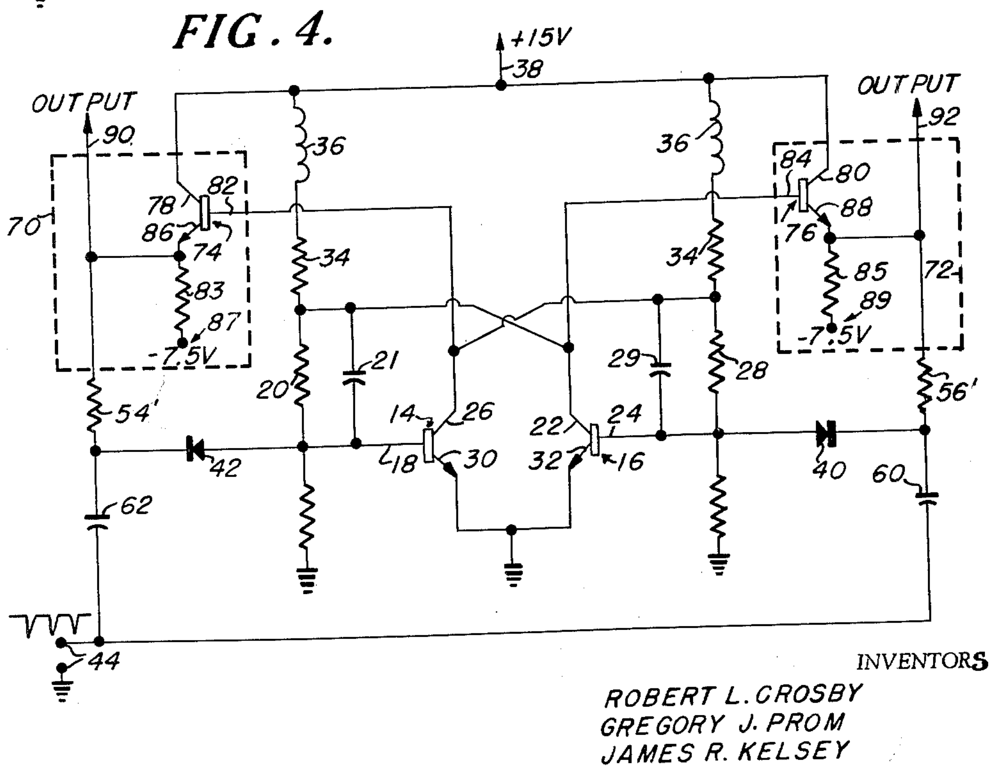
FIGURE 4 is a schematic diagram showing how the circuit of FIGURE 2 may be modified to obtain a low output impedance, without appreciably loading the flip-flop.
Figure 5:
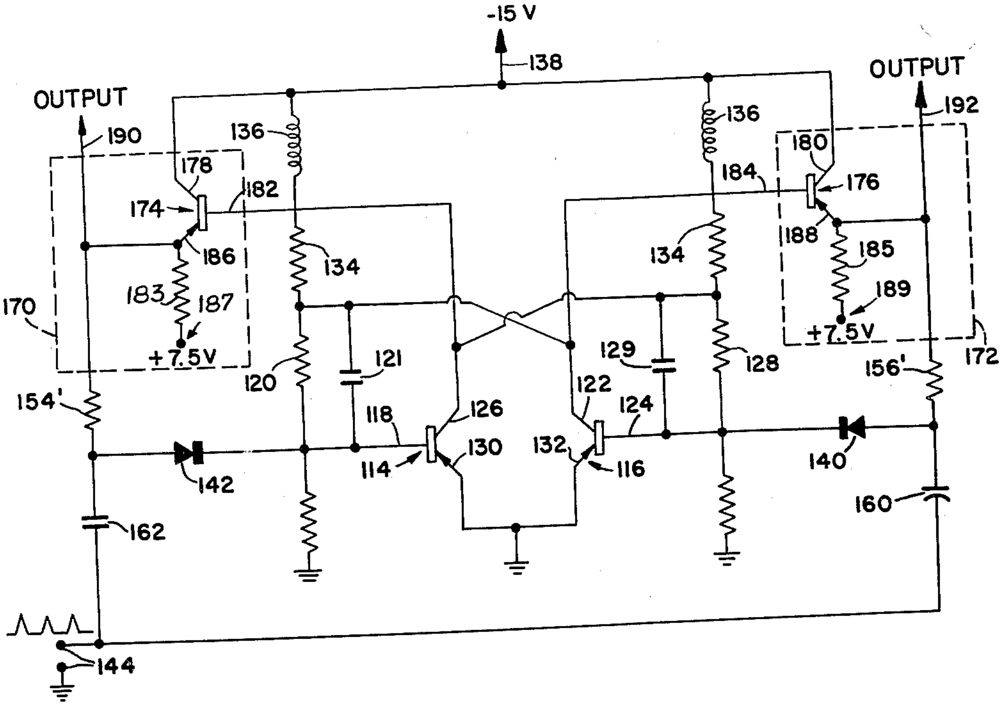
FIGURE 5 is p-n-p version of the FIGURE 4 circuit.

It will be appreciated by those skilled in the art that the circuit of FIGURE 3 may be similarly supplied with emitter followers comprising transistors of the p-n-p type to obtain low impedance outputs where it is desired to count positive-going spikes, for example as in FIGURE 5 which illustrates a p-n-p version of the FIGURE 4 circuit. Operation of the FIGURE 5 circuit is similar to that described for the circuit in FIGURE 4 with it being understood that corresponding parts in the two figures differ in the numbering system by a factor of 100.

Modifications of this invention not described herein will be apparent to those skilled in the art and it is intended that the matter contained in the foregoing description be interpreted as illustrative and not limitative, the scope of the invention being defined in the appended claims.

What is claimed is:

1. A bistable circuit for operation between stable states in response to successive unipolar signals comprising two transistors each having collector, emitter, and base electrodes, the collector electrode of each transistor being coupled to the base electrode of the other transistor and the emitter electrode of each transistor being connected to a common junction, input means for receiving said unipolar signals, two unidirectional current conducting devices coupled respectively to the base electrodes of said two transistors, two capacitive means coupled respectively to the unidirectional devices and commonly coupled to said input means for passing said successive unipolar signals alternately to the two base electrodes, and means for each unidirectional device coupling same to the respective collector electrodes for preventing capacitive loading of the transistors and for decreasing the time constants associated with the respective capacitive means, the arrangement being such that in response to a unipolar signal one collector electrode obtains a potential of relatively high magnitude while the other collector electrode obtains a potential of relatively low magnitude and one of said unidirectional devices is biased to non-conduction by the high magnitude potential of the collector electrode connected thereto while the other of said unidirectional devices is biased to at least a nearly conductive condition by the low magnitude potential of the collector electrode connected thereto, the application of another of said unipolar signals to the input means causing the high potential at said one collector electrode to change to said low magitude potential and bias said one unidirectional device to at least a nearly conductive condition and causing the low potential at said other collector electrode to change to said high magnitude potential and bias said other unidirectional device to non-conduction.

2. A circuit as in claim 1 arranged to receive all negative pulses.

3. A circuit as in claim 1 arranged to receive all positive pulses.

4. A bistable circuit for operation between stable states in response to successive unipolar signals comprising two transistors each having a high and a low stable state and a collector, emitter, and base electrode, the collector electrode of each transistor being at least resistively coupled to the base electrode of the other transistor and the emitter electrode of each transistor being connected to a common junction, input means for receiving said unipolar signals, two unidirectional current conducting devices each connected between a different base electrode and the input means, and coupling means for each transistor connecting the collector electrode thereof to a point between said input means and the unidirectional current conducting device associated with the base electrode of the same transistor for permitting the potential of the collector electrodes to bias the associated unidirectional device, each of said coupling means including only one semi-conductive type device, the arrangement being such that in response to a unipolar signal one collector electrode obtains a potential of relatively high magnitude while the other collector electrode obtains a potential of relatively low magnitude and one of said unidirectional devices is biased to non-conduction by the high magnitude potential of the collector electrode connected thereto while the other of said unidirectional devices is biased to at least a nearly conductive condition by the low magnitude potential of the collector electrode connected thereto, the application of another of said unipolar signals to the input means causing the high potential at said one collector electrode to change to said low magnitude potential and bias said one unidirectional device to at least a nearly conductive condition and causing the low potential at said other collector electrode to change to said high magnitude potential and bias said other unidirectional device to non-conduction.

5. Apparatus as in claim 4 wherein the said semiconductive type device in at least one of said coupling means is a transistor connected as an emitter follower and said one coupling means includes a resistor in series with the emitter electrode therein.

6. A bistable circuit for operation between stable states in response to successive negative signals comprising two n-p-n junction transistors each having a high stable operating state and a low stable operating state and collector, emitter, and base electrodes, the collector electrode of each being coupled to the base electrode of the other, coupling means including a single semi-conductive device for each transistor interconnecting its collector and base electrodes and further comprising a resistor and a unidirectional current conducting element in series, the positive end of the unidirectional elements being connected to the base electrodes, part of said coupling means serving to control the operation of the associated unidirectional element in accordance with the potential of the associated collector electrode, and input means for receiving said negative signals coupled to the negative end of each of said unidirectional elements, each semi-conductive device and its associated said resistor as a combination being connected at a point between the input means and the associated unidirectional element, the arrangement being such that in response to a negative signal one transistor is in a high stable operating state and the potential at its collector electrode is large so that the associated unidirectional element is biased to prevent passage of said negative signals while the other transistor is in a low stable operating state and the potential at its collector electrode is small so that the associated unidirectional element is biased to allow passage of another of said negative signals which when forthcoming shifts each transistor to the other stable operating state.

7. Apparatus as in claim 6 wherein said single semi-conductive devices are other transistors respectively connected to said collector electrodes as emitter followers with the emitters thereof being in series respectively with said resistors.

8. A bistable circuit for operation between two stable states in response to successive positive signals comprising two p-n-p junction transistors each having a high stable operating state and a low stable operating state and collector, emitter, and base electrodes, the collector electrode of each being coupled to the base electrode of the other, coupling means including a single semi-conductive device for each transistor interconnecting its collector and base electrodes and further comprising a resistor and a unidirectional current conducting element in series, the negative end of the unidirectional elements being connected to the base electrodes and part of said coupling means serving to control the operation of the associated unidirectional element in accordance with the potential of the associated collector electrode, and input means for receiving said positive signals coupled to the positive end of each of said unidirectional elements, each semi-conductive device and its associated said resistor as a combination being connected at a point between the input means and the associated unidirectional element, the arrangement being such that in response to a positive signal one transistor is in a high stable operating state and the potential at its collector electrode is large so that the associated unidirectional element is biased to prevent passage of one of said positive signals while the other transistor is in a low stable operating state and the potential at its collector electrode is small so that the associated unidirectional element is biased to allow passage of one of said positive signals which when forthcoming shifts each transistor to the other stable operating state.

9. Apparatus as in claim 8 wherein at least one of said semi-conductive type devices comprises another unidirectional element connected in series with said first mentioned unidirectional element and in parallel with said resistor.

10. Apparatus as in claim 8 wherein said single semi-conductive devices are other transistors respectively connected to said collector electrodes as emitter followers with the emitters thereof being in series with said resistors respectively.

11. A bistable circuit for operation between stable states in response to successive unipolar signals comprising two transistors each having a high and a low stable state and a collector, emitter, and base electrode, the collector electrode of each transistor being coupled to the base electrode of the other transistor and the emitter electrode of each transistor being connected to a common junction, input means for receiving said unipolar signals, two unidirectional current conducting devices each connected between a different base electrode and the input means, and coupling means for each transistor connecting the collector electrode thereof to the unidirectional current conducting device associated therewith for permitting the potential of the collector electrodes to bias the associated unidirectional device, at least one of said coupling means comprising a resistor in parallel with a second unidirectional current conducting device, the arrangement being such that in response to a unipolar signal one collector electrode obtains a potential of relatively high magnitude while the other collector electrode obtains a potential of relatively low magnitude and one of said unidirectional devices is biased to non-conduction by the high magnitude potential of the collector electrode connected thereto while the other of said unidirectional devices is biased to at least a nearly conductive condition by the low magnitude potential of the collector electrode connected thereto, the application of another of said unipolar signals to the input means causing the high potential at said one collector electrode to change to said low magnitude potential and bias said one unidirectional device to at least a nearly conductive condition and causing the low potential at said other collector electrode to change to said high magnitude potential and bias said other unidirectional device to non-conduction.

12. A bistable circuit for operation between stable states in response to successive negative signals comprising two n-p-n junction transistors each having a high stable operating state and a low stable operating state and collector, emitter, and base electrodes, the collector electrode of each being coupled to the base electrode of the other, coupling means for each transistor interconnecting its collector and base electrodes and comprising a resistor and a unidirectional element in series, the positive end of the unidirectional elements being connected to the base electrodes, part of said coupling means serving to control the operation of the associated unidirectional element in accordance with the potential of the associated collector electrode, and input means for receiving said negative signals coupled to the negative end of each of said unidirectional elements, at least one of said coupling means further comprising another unidirectional element connected in series with said first mentioned unidirectional element and in parallel with said resistor, the arrangement being such that in response to a negative signal one transistor is in a high stable operating state and the potential at its collector electrode is large so that the associated unidirectional element is biased to prevent passage of said negative signals while the other transistor is in a low stable operating state and the potential at its collector electrode is small so that the associated unidirectional element is biased to allow passage of another of said negative signals which when forthcoming shifts each transistor to the other stable operating state.

13. A bistable circuit for operation between stable states in response to successive unipolar signals comprising two transistors each having a high and a low stable state and a collector, emitter, and base electrode, the collector electrode of each transistor being at least resistively coupled to the base electrode of the other transistor and the emitter electrode of each transistor being connected to a common junction, input means for receiving said unipolar signals, two unidirectional current conducting devices each connected between a different base electrode and the input means, and two feed back circuits, each including a resistor and only one semi-conductive body, for respectively connecting the collector electrodes of the transistors to a point between the input means and the respective unidirectional device coupled to the base of the same transistor, the arrangement being such that in response to a unipolar signal one collector electrode obtains a potential of relatively high magnitude while the other collector electrode obtains a potential of relatively low magnitude and one of said unidirectional devices is biased to non-conduction by the high magnitude potential of the collector electrode connected thereto while the other of said unidirectional devices is biased to at least a nearly conductive condition by the low magnitude potential of the collector electrode connected thereto, the application of another of said unipolar signals to the input means causing the high potential at said one collector electrode to change to said low magnitude potential and bias said one unidirectional device to at least a nearly conductive condition and causing the low potential at said other collector electrode to change to said high magnitude potential and bias said other unidirectional device to non-conduction.

14. A circuit as in claim 13 wherein the semi-conductive body in at least one of said feedback circuits is a diode in parallel with the resistor in said one feedback circuit, said diode being poled oppositely to the unidirectional device connected thereto with respect to any unipolar input signal.

15. A circuit as in claim 13 wherein the semi-conductive body in at least one of said feedback circuits is another transistor connected to the associated one of said collector electrodes as an emitter follower with the emitter of said another transistor being in series with its associated said resistor.

16. A bistable circuit for operation between stable states in response to successive unipolar signals comprising two transistors each having a high and a low stable state and a collector, emitter, and base electrode, the collector electrode of each transistor being coupled to the base electrode of the other transistor and the emitter electrode of each transistor being connected to a common junction, input means for receiving said unipolar signals, two unidirectional current conducting devices each connected between a different base electrode and the input means, and two feedback circuits each including a resistor and only one semi-conductive body, for respectively connecting the collector electrodes of the transistors to a point between the unidirectional device coupled to the base of the same transistor and said input means, the semi-conductive body in each feedback circuit being another transistor with the base and emitter electrodes thereof being respectively connected to the collector electrode of one of the first-mentioned transistors and serially to the associated resistor, the impedance values of said resistors in the two feedback circuits being each substantially less than the impedance value of the resistor in said one feedback circuit of claim 14, the arrangement being such that in response to a unipolar signal one collector electrode obtains a potential of relatively high magnitude while the other collector electrode obtains a potential of relatively low magnitude and one of said unidirectional devices is biased to non-conduction by the high magnitude potential of the collector electrode connected thereto while the other of said unidirectional devices is biased to at least a nearly conductive condition by the low magnitude potential of the collector electrode connected thereto, the application of another of said unipolar signals to the input means causing the high potential at said one collector electrode to change to said low magnitude potential and bias said one unidirectional device to at least a nearly conductive condition and causing the low potential at said other collector electrode to change to said high magnitude potential and bias said other unidirectional device to non-conduction.

17. A bistable circuit for operation between stable states in response to successive unipolar signals comprising two transistors each having collector, emitter, and base electrodes, the collector electrode of each transistor being coupled to the base electrode of the other transistor and the emitter electrode of each transistor being connected to a common junction, input means for receiving said unipolar signals, two unidirectional current conducting devices coupled respectively to the base electrodes of said two transistors, two capacitive means coupled respectively to the unidirectional devices and commonly coupled to said input means for passing said successive unipolar signals alternately to the two base electrodes, and means for each unidirectional device coupling same to the respective collector electrodes for preventing capacitive overloading of the transistors and for allowing a decrease of the time constant associated with the respective capacitive means, the arrangement being such that in response to a unipolar signal one collector electrode obtains a potential of relatively high magnitude while the other collector electrode obtains a potential of relatively low magnitude and one of said unidirectional devices is biased to non-conduction by the high magnitude potential of the collector electrode connected thereto while the other of said unidirectional devices is biased to at least a nearly conductive condition by the low magnitude potential of the collector electrode connected thereto, the application of another of said unipolar signals to the input means causing the high potential at said one collector electrode to change to said low magnitude potential and bias said one unidirectional device to at least a nearly conductive condition and causing the low potential at said other collector electrode to change to said high magnitude potential and bias said other unidirectional device to non-conduction.

18. A bistable circuit for operation between stable states in response to successive unipolar signals comprising two transistors each having collector, emitter, and base electrodes, the collector electrode of each transistor being coupled to the base electrode of the other transistor and the emitter electrode of each transistor being connected to a common junction, input means for receiving said unipolar signals, two unidirectional current conducting devices coupled respectively to the base electrodes of said two transistors, two capacitive means coupled respectively to the unidirectional devices and commonly coupled to said input means for passing said successive unipolar signals alternately to the two base electrodes, and means including a resistor for each unidirectional device for coupling same to the respective collector electrodes for preventing capacitive overloading of the transistors and for making the operating time constant associated with the respective capacitive means less than that effected when the respective said coupling means includes only a resistor, the arrangement being such that in response to a unipolar signal one collector electrode obtains a potential of relatively high magnitude while the other collector electrode obtains a potential of relatively low magnitude and one of said unidirectional devices is biased to non-conduction by the high magnitude potential of the collector electrode connected thereto while the other of said unidirectional devices is biased to at least a nearly conductive condition by the low magnitude potential of the collector electrode connected thereto, the application of another of said unipolar signals to the input means causing the high potential at said one collector electrode to change to said low magnitude potential and bias said one unidirectional device to at least a nearly conductive condition and causing the low potential at said other collector electrode to change to said high magnitude potential and bias said other unidirectional device to non-conduction.

(References on following page)

References Cited in the file of this patent

UNITED STATES PATENTS

| | | |
|---|---|---|
| 2,569,345 | Shea | Sept. 25, 1951 |
| 2,589,240 | Frye | Mar. 18, 1952 |
| 2,644,887 | Wolfe | July 7, 1953 |
| 2,665,845 | Trent | Jan. 12, 1954 |
| 2,673,936 | Harris | Mar. 30, 1954 |
| 2,706,811 | Steele | Apr. 19, 1955 |
| 2,719,228 | Auerbach et al. | Sept. 27, 1955 |
| 2,723,080 | Curtis | Nov. 8, 1955 |
| 2,869,000 | Bruce | Jan. 13, 1959 |
| 2,884,544 | Warnock | Apr. 28, 1959 |

OTHER REFERENCES

Yeager, R. E.: "A Gray to Binary Translator and Shift Resistor," published in The Transistor (December 4, 1951), pps. 611–626, a publication prepared by Bell Telephone Laboratories, Inc. for Western Electric Co., Inc., New York, New York.